(12) United States Patent (10) Patent No.: US 7,808,498 B2
Minami et al. (45) Date of Patent: *Oct. 5, 2010

(54) CAD DATA EVALUATION METHOD AND EVALUATION APPARATUS

(75) Inventors: Shunsuke Minami, Mito (JP); Koji Shiroyama, Hitachinaka (JP); Tsutomu Sasaki, Hitachi (JP)

(73) Assignee: Hitachi, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/822,030

(22) Filed: Jun. 29, 2007

(65) Prior Publication Data

US 2008/0065625 A1 Mar. 13, 2008

Related U.S. Application Data

(63) Continuation of application No. 11/396,623, filed on Apr. 4, 2006, now Pat. No. 7,248,256, which is a continuation of application No. 10/279,887, filed on Oct. 25, 2002, now Pat. No. 7,053,892.

(30) Foreign Application Priority Data

May 7, 2002 (JP) ............................. 2002-131373

(51) Int. Cl.
*G06T 15/00* (2006.01)
(52) U.S. Cl. .................. 345/418; 345/3.2; 345/211; 345/572; 710/2; 716/11
(58) Field of Classification Search ............ 345/3.2, 345/3.3, 418, 419, 211, 572, 581, 596, 619; 710/2; 716/11
See application file for complete search history.

(56) References Cited

U.S. PATENT DOCUMENTS 5,508,714 A 4/1996 Zenda (Continued)

FOREIGN PATENT DOCUMENTS

JP 06-168301 6/1994

OTHER PUBLICATIONS

Barron, J.L. et al., Performance of Optical Flow Temperature; 0-8186-2855-3/92; © 1992 IEEE; pp. 236-242. Not Yet Assigned.

(Continued)

*Primary Examiner*—Phu Nguyen
(74) *Attorney, Agent, or Firm*—Dickstein Shapiro LLP

(57) ABSTRACT

The apparatus has an evaluated value calculating means 102 for calculating the complexity of the object shape and the complexity of the modeling structure of the object CAD data input by the CAD data inputting means 101; a searching means 104 for searching the reference CAD data in the reference CAD data base 103 in accordance with the condition of said complexity; an evaluated value calculating means 106 for calculating the complexity of the object shape and the complexity of the modeling structure based on the searched reference CAD data; and a displaying means 105 for evaluated values obtained by the means 102 and the means 106 on the graphic representation defining its horizontal axis for the complexity of the object shape and its vertical axis for the complexity of the modeling structure. It will be appreciated that the man-hour for evaluating large amount of various models can be reduced by means of not using a CAD system.

2 Claims, 11 Drawing Sheets

U.S. PATENT DOCUMENTS

| | | | |
|---|---|---|---|
| 5,757,338 | A | 5/1998 | Bassetti et al. |
| 5,900,849 | A | 5/1999 | Gallery |
| 6,009,210 | A | 12/1999 | Kang |
| 6,028,585 | A | 2/2000 | Ishii et al. |
| 6,115,032 | A | 9/2000 | Kotha et al. |
| 6,118,413 | A | 9/2000 | Brii et al. |
| 6,449,761 | B1 * | 9/2002 | Greidinger et al. ............ 716/11 |
| 6,490,005 | B1 | 12/2002 | Steinbach et al. |
| 6,512,995 | B2 | 1/2003 | Murao |
| 6,646,641 | B1 | 11/2003 | White et al. |
| 6,804,724 | B2 | 10/2004 | Shin |
| 7,053,892 | B2 * | 5/2006 | Minami et al. .............. 345/418 |
| 7,248,256 | B2 * | 7/2007 | Minami et al. .............. 345/418 |
| 2003/0043140 | A1 | 3/2003 | Ko et al. |

OTHER PUBLICATIONS

Hamburgen, William R., et al., Itsy: Stretching the Bounds of Mobile Computing; IEEE Computer, Apr. 2001, vol. 34, No. 4, http://computer.org/computer/homepage/april/comppract/cp.1htm; pp. 28-36.

Sawhney, Harpreet, S. et al., Model-Based 2D & 3D Dominant Motion Estimation for Mosaicing and Video Representative; 0-8186-7042-8/95; © 1995 IEEE; pp. 583-590.

* cited by examiner

| DATA ITEM \ DATA | DATA 1 | DATA 2 | DATA 3 | DATA 4 |
|---|---|---|---|---|
| COMPORNENT NAME | | | | |
| VOLUME | | | | |
| SURFACE AREA | | | | |
| INERTIA MOMENTUM | | | | |
| THE NUMBER OF FEATURES | | | | |
| THE NUMBER OF DEFINED DIMENSIONAL PARTS | | | | |
| THE NUMBER OF CHRACTER SEGMENTS | | | | |
| MINIMUM RIDGE LENGTH | | | | |

| | OBJECT DATA | REFERENCE DATA TO BE COMPARED WITH | | | |
|---|---|---|---|---|---|
| | | DATA 1 | DATA 2 | DATA 3 | DATA 4 |
| COMPONENT NAME | | | | | |
| THE COMPLEXITY OF THE MODELING STRUCTURE | | | | | |
| THE COMPLEXITY OF THE OBJECT SHAPE | | | | | |

CAD DATA EVALUATION METHOD AND EVALUATION APPARATUS

CROSS-REFERENCE TO RELATED APPLICATIONS

This application is a continuation of U.S. patent application Ser. No. 11/396,623, filed on Apr. 4, 2006, now U.S.Pat. No.7,248,256 which is a continuation of U.S. application Ser. No. 10/279,887, filed on Oct. 25, 2002, now U.S. patent application Ser. No. 7,053,892, the disclosures of both of which are incorporated in their entirety by reference herein.

BACKGROUND OF THE INVENTION

The present invention relates to a technology for estimating the reusability of the three-dimensional CAD (Computer-Aided Design) data. In addition, the present invention relates to a technology for estimating the modeling skill of the CAD system operator.

When generating the CAD data of the design object using the three-dimensional CAD system, there are several modeling methods to be applied to an identical design shape. In case of generating the CAD data for the design shape shown in FIG. 16, several variations for the modeling method are described. As one of the methods for generating the CAD data of the design shape shown in the figure, as shown in FIG. 17, (a) the cross-section is defined as a closed geometric figure, and this closed geometric figure is made to rotate in the center line at first, and next (b) the design shape is generated by removing the bolt hole by subtraction operation. As another method, as shown in FIG. 18, the same design shape can be generated by means that (a) the cylinder corresponding to the flange is defined, (b) the cylinder on the axis is defined and a unified body is defined by add operation of the flange and this axial cylinder, (c) a hole is removed by subtraction operation, and (d) the bolt hole is removed by subtraction operation.

As described above, there are alternative modeling methods for generating the CAD data for an identical design shape, and the difference in the modeling methods has influence on the easiness for modifying the model. For example, in case of modifying the circular shape of the hole shown in FIG. 16 to a rectangular hole, the closed geometric figure shown in FIG. 17 (a) should be modified in the modeling method in FIG. 17. On the other hand, in the modeling method in FIG. 18, the target figure shown in FIG. 19 can be obtained only by removing the hole at Step (c) with the rectangular cylinder to be used for subtraction operation instead of using the circular cylinder.

There arise many design modifications in the design process for the actual products. In the design process, the easiness in modifying the model may contribute to the design productivity. In addition, in applying the existing components to new products, it may contribute to the design productivity that the components to be applied properly are retrieved and their three-dimensional CAD data can be modified. However, as shown in FIGS. 17 and 18, the modification complexity and its man-hour depends upon the modeling methods very much. The man-hour for the overall modeling process can be reduced by generating the CAD data by the modeling method with its modification complexity being lower.

The selection of the modeling method for the CAD data depends upon the skill of the CAD system operators. The operator having a higher skill can select such a modeling method as being adequate for reusing the CAD data and generate the model which can be easy for modification. However, the operator having a lower skill may have an inclination to select such a modeling method as shown in FIG. 17 and thus, may generate the model which may be difficult for reuse.

In the prior art, major methods for estimating the modeling method trace the modeling history and the feature structure of the model by using the CAD system. As for the estimation system using computers, there is such method for estimating whether the selected method is compliance with the exceptional conditions for modeling and users' criteria by verifying the predefined check items individually or verifying their combinations.

In the method in which the modeling history and its feature structure are estimated manually by the operator with the CAD system, it is required to read in the individual CAD data into the CAD system and their feature structure should be estimated. In case that the design object includes complex shapes and the large volume of CAD data is estimated, there is such a problem that the man-hour for estimation work becomes too large.

And furthermore, in the estimation systems in which the predetermined items are verified, as only the check items related directly to the exceptional conditions and the modeling criteria can be estimated, there is such a problem that the applicable models and the supported check items are limited.

SUMMARY OF THE INVENTION

An object of the present invention is to provide an estimation method and an apparatus for estimating the CAD data enabling to reduce the estimation man-hour. In addition, the present invention is to provide an estimation method and an apparatus for estimating the CAD data enabling to estimate the CAD data for arbitrary shaped design objects.

In order to attain the above object, in the estimation method of CAD data for estimating the modeling method of CAD data, what is characterized is that, inputting the CAD data, the complexity of the object shape in said CAD data is calculated as well as the complexity of the model structure of said CAD data is calculated.

And furthermore, what is characterized is that, retrieving the reference data related to said object CAD data from the data base in which plural CAD data are stored so as to be enabled to be referred, the complexity of the object shape and the complexity of the model structure are calculated as evaluated values of said reference CAD data, and the evaluated value related to said object CAD data and said reference CAD data are displayed so as to be compared with each other.

The evaluated values are displayed on a graph represented with the X-axis for the complexity of the object shape and with the Y-axis for the complexity of the model structure.

What is characterized is that the object CAD data and the reference CAD data have their own shape data, and the shape data corresponding to the evaluated value is displayed on the display position of the evaluated value.

What is characterized is that the complexity of the object shape is defined as a value calculated on the basis of the volume and either the surface area or the moment of inertia, each included in the CAD data or calculated numerically, and that the complexity of the model structure is defined as either of the number of features, the number of defined dimensional parts, the number of surfaces and the minimum edge length in the CAD data.

What is characterized is that the CAD data estimation apparatus of the present invention comprises an evaluation data specifying means for specifying the CAD data to be evaluated; an object CAD data evaluating means for calculating the complexity of the object shape and the complexity of the model structure from the CAD data specified by said evaluation data specifying means; data base for storing plural sets of CAD data to be compared; a retrieval means for retrieving a reference CAD data related to the object CAD data in said data base; a reference CAD data evaluating means for calculating the complexity of the object shape and the complexity of the model structure from the reference CAD data retrieved by said retrieval means; and a display means for receiving the complexity of the object shape and the complexity of the model structure, each calculated by said object CAD data evaluating means and said reference CAD data evaluating means, respectively, and for displaying the evaluated results based on those complexity measures.

What is characterized is that, for the complexity of the object shape and the complexity of the model structure calculated by said reference CAD data estimating means, a judging means is defined for judging whether the complexity of the object shape and the complexity of the model structure are located in a designated value range.

The present invention relates to a CAD data evaluation system configured as a client and a server, both connected by a network, in which said server has a data base for storing plural sets of CAD data to be referred for the comparison operation, and a model evaluating means for receiving the object CAD data and evaluating the complexity of the object shape and the complexity of the model structure, both in the object CAD data and the reference CAD data in said data base, and the server sends the evaluation results to a display means of the said client through the network.

DETAILED DESCRIPTION OF THE PREFERRED EMBODIMENTS

Figure 2:
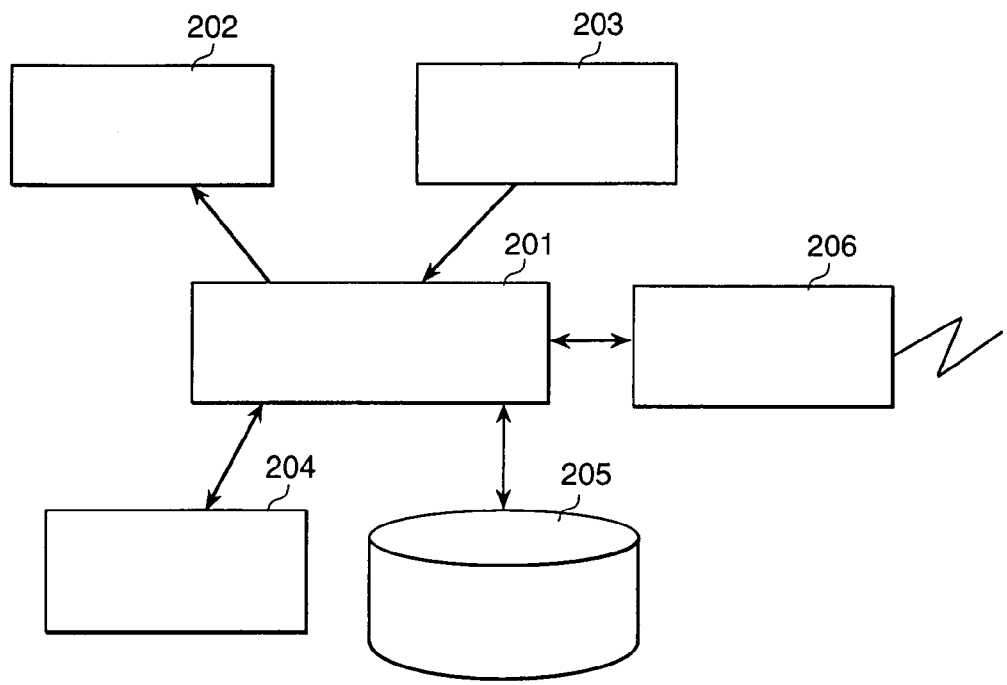
FIG. 2 is a hardware configuration diagram of the CAD data estimation apparatus applying the present invention.

Now, one embodiment of the CAD data evaluating apparatus of the present invention will be described. FIG. 2 shows a hardware configuration of the CAD data evaluating apparatus applying the present invention. The CAD data evaluating apparatus is composed as a computer system, which includes an arithmetic unit 201, a display apparatus 202, an input apparatus 203 such as keyboard and mouse, a memory unit 204 for storing the programs and data and an external storage apparatus 205 for storing CAD data. The model evaluating means is mainly composed of the arithmetic unit 102. This configuration also includes a communication unit for exchanging data and programs with other computer systems.

Figure 1:
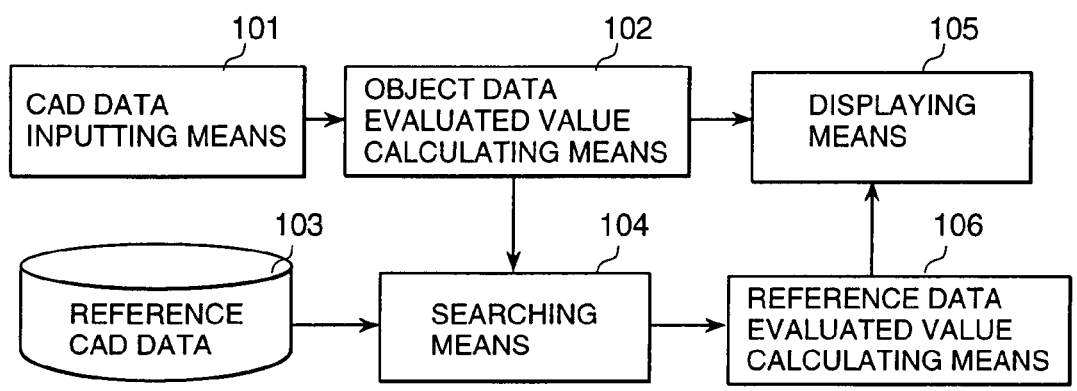
FIG. 1 is a functional block diagram of the CAD data estimation apparatus in one embodiment of the present invention.

FIG. 1 shows a functional diagram of the CAD data evaluating apparatus in one embodiment of the present invention. The CAD data input means captures the operator's instruction and specifies the three-dimensional CAD data to be evaluated in accordance with the operator's instruction. The object data evaluating calculation means 102 reads in the specified three-dimensional CAD data, and calculates the parameter related to the complexity of the object shape and the parameters related to the complexity of the model structure.

The reference data base 103 stores plural sets of reference CAD data to be compared with the object CAD data. The reference CAD data retrieving means 104 retrieves the CAD data stored in the reference CAD data base 103 on the basis of the attributes of the CAD data for evaluation received through the input means 101 by the object data evaluating means 102 or on the basis of the complexity of the object shape or the complexity of the model structure, each calculated. The CAD data or the attribute data which match the specified condition are retrieved. The reference data evaluation calculation means 106 calculates the complexity of the object shape and the complexity of the model structure from the object CAD data retrieved by the retrieving means 104 or the attribute data. The result displaying means 105 receives its input data including the parameter related to the complexity of the object shape evaluated from the object CAD data, the parameter related to the model structure, the complexity of the object shape and the complexity of the model structure, both evaluated from the reference CAD data, and displays the comparison result on the displaying apparatus 202.

Figure 3:
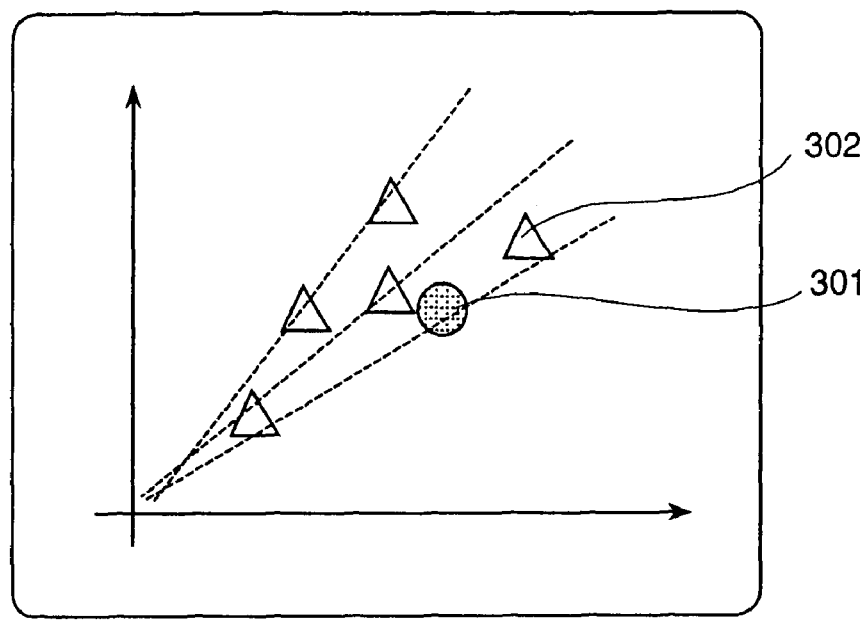
FIG. 3 is a screen window image illustrating an example of the estimation results.

FIG. 3 shows an example of the display screen image for comparing the evaluating results of CAD data. The graph has a vertical axis representing the complexity of the object shape and a horizontal axis representing the complexity of the model structure, and the evaluating results are plotted on the graph. The marker 301 is a single point for representing the evaluated value of the object CAD data, and the markers 302 are points for representing plural reference data.

The complexity of the object shape is an index which indicates a similar value for a similar object shape to be modeled independent of the modeling method, that is, the combination of features or the partition method of the surfaces. In addition, the more the object shape is complex with concave and convex parts, the higher the complexity is. For example, the volume and the area must be maintained not to be changed for the design object to be modeled, but those indices are subject to the size of the object shape. Therefore, it is required to be normalized as non-dimensional numbers so as not to be subject to the size of the object shape. The complexity of the object shape is defined by the equation 1.

$$\text{Complexity of Object Shape} = (\text{Surface area})^{1/2}/(\text{Volume})^{1/3} \quad (1)$$

This definition means that, the larger the surface area of the design object with an identical volume, the more the complexity of the design object enclosed with complicated surfaces. In addition, the factor of the size of the object shape can be normalized by dividing with its volume. As for the definition of the complexity of the object shape, the ratio of the surface area of a hypothetical cube containing the object shape to the surface area of the object shape may be an alternative definition.

The moment of inertia may be used for the index representing the feature of the object shape. The complexity of the object shape defined with the moment of inertia is calculated by the equation 2. The moment of inertia is a physical quantity measured by the square of the length. In this example, this physical quantity is made non-dimensional by dividing the square root of the moment of inertia by the cubic root of the volume.

$$\text{Complexity of object shape} = (\text{Inertia moment})^{1/2}/(\text{Volume})^{1/3} \quad (2)$$

The complexity of the model structure is defined as an index respecting the complexity of the modeling operations and their dependency. For example, this index may be the number of features the number of defined dimensional parts and the depth of the feature hierarchy. This index may be related to the shape data dependent upon the modeling method. For example, the number of surfaces depends upon the modeling scheme. Alternatively, this index may be defined by the number of edges or its minimum length in the Boundary Representation used for representing the three-dimensional objects.

Figure 16:
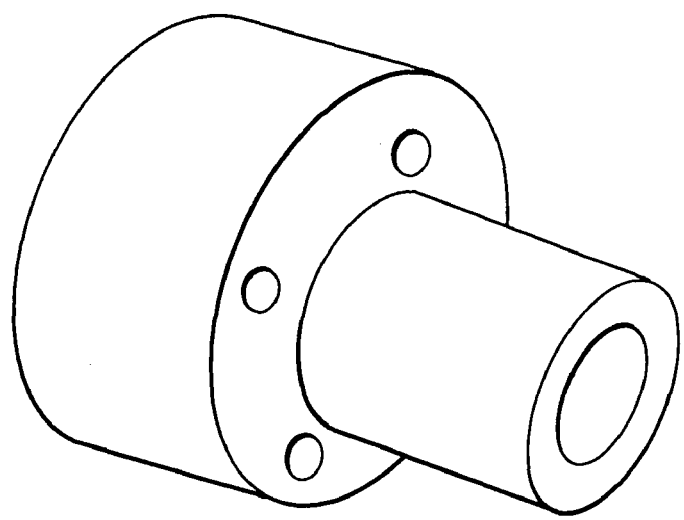
FIG. 16 is a perspective view illustrating an example of CAD data.
Figures 17A, 17B:
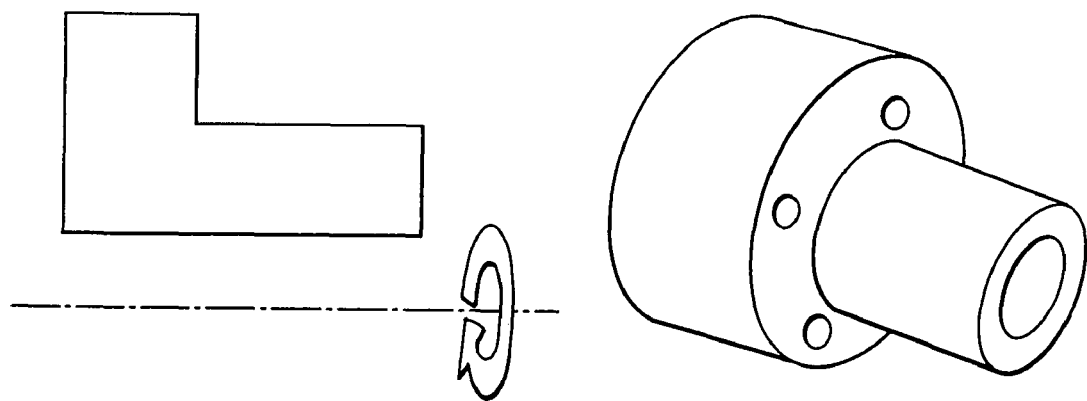
FIG. 17 is an explanation drawing illustrating the method for generating the CAD data.
Figure 18A:
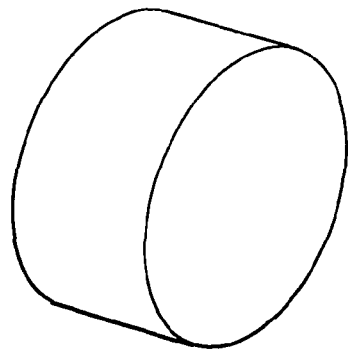
FIG. 18 is an explanation drawing illustrating another example of the method for generating the CAD data.
Figure 18B:
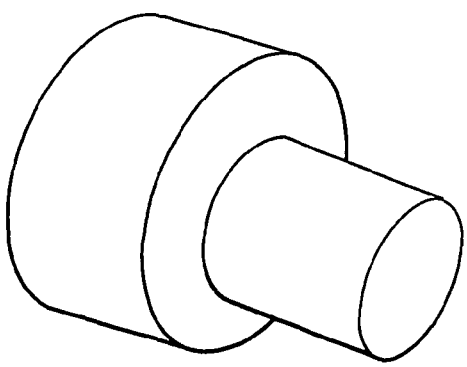
Figure 18C:
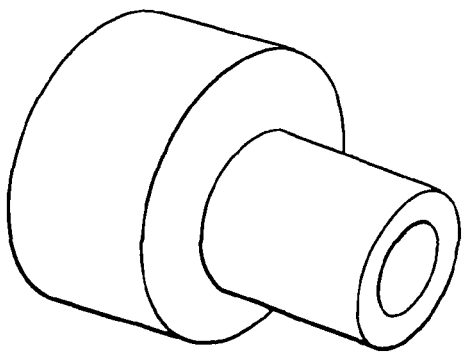
Figure 18D:
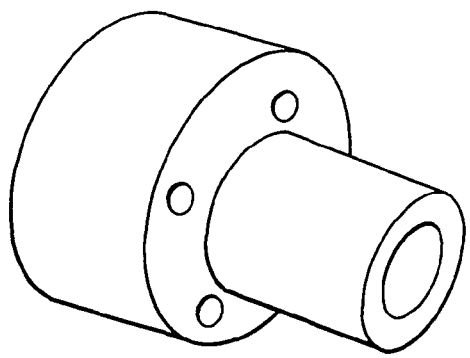
Figure 19:
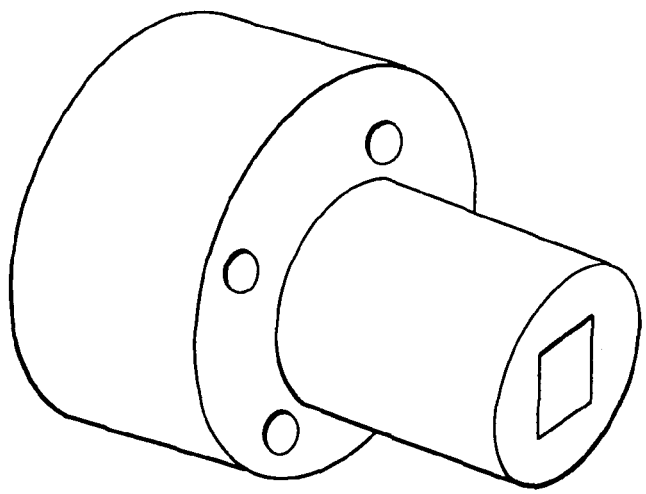
FIG. 19 is a perspective view illustrating the CAD data in the modified mode of FIG. 16.

In this context, the feature means a unit for defining the object shape. Referring to FIG. 16, the calculation method for the number of features in the object shape shown is described below. In the model generating method of FIG. 17, one feature is defined by generating a two-dimensional object shape of the cross-section at Step (a). Next, each of the bolt holes makes individual features at Step (b). Therefore, the object shape is defined by five features in the model generating method shown in FIG. 17. On the other hand, in the model generating method shown in FIG. 18, a single feature is defined individually at Steps (a), (b) and (c), and next, four bolt holes are formed by the subtraction operation at Step (d). In the model generating method shown in FIG. 18, the object shape data composed of seven features is generated consequently. As described above, the number of features is calculated.

The number of defined dimensional parts is calculated by summing the dimension of the specified part along in the process of defining the feature. For example, in the object shape shown in (a) of FIG. 18, two dimensions, diameter and length, are required to define the object shape of the cylinder. For the bolt hole in (d) of FIG. 18, two dimensions, the diameter of the bolt hole and the diameter of the circle on which the bolt holes are arranged, are required. Thus, the number of defined dimensional parts is calculated by summing the dimension of specified parts defining the shape and position of the individual feature.

The number of surfaces is calculated as the sum of the number of surfaces composing the three-dimensional design object, defined by Boundary Representation for defining the three-dimensional design object. The combination of features affects the difference in the partition of surfaces, which makes an effect on the total number of defined surfaces.

The number of ridge lines is considered in the similar manner. In case of the design object composed of more surfaces for a designated object shape, the set operation and the geometric operation for generating the tool path for CAM application may result in unstable solutions due to the error at the surface boundaries. Thus, an object modeling with excess number of surfaces may reduce the reusability of the object models.

The minimum length of ridge lines is also used as an index indicating the robustness of the shape model of the design object with respect to the geometric operations. Too short ridge line makes the precision in the set operation around this ridge line unstable. Therefore, the longer the minimum length of ridge lines, the higher the robustness to the set operation and the reusability of the shape model.

In general, as the complexity in the object shape gets higher, its modeling structure becomes more complex in order to represent its complexity. For example, it is required to generates many features in order to define a complex shape. Thus, there supposed to be a positive correlation between the complexity of the object shape and the complexity of the modeling structure. However, too many excessive features or too roughly approximated and too small numbered features may break this positive correlation for any modeling method.

The marker 301 in FIG. 3 is an example of plotting on the plane spanned with the complexity of the object shape and the complexity of the modeling structure, both of the object model. The markers 302 designated by triangle symbols are plotted on the plane spanned with the complexity of the object shape and the complexity of the modeling structure, both of the reference model data stored in the data base 103. According to this plotted markers, if the marker 301 is located near the data constellation of the reference model, it is proved that the modeling method of the design object is not far beyond the reference model method.

Figure 4:
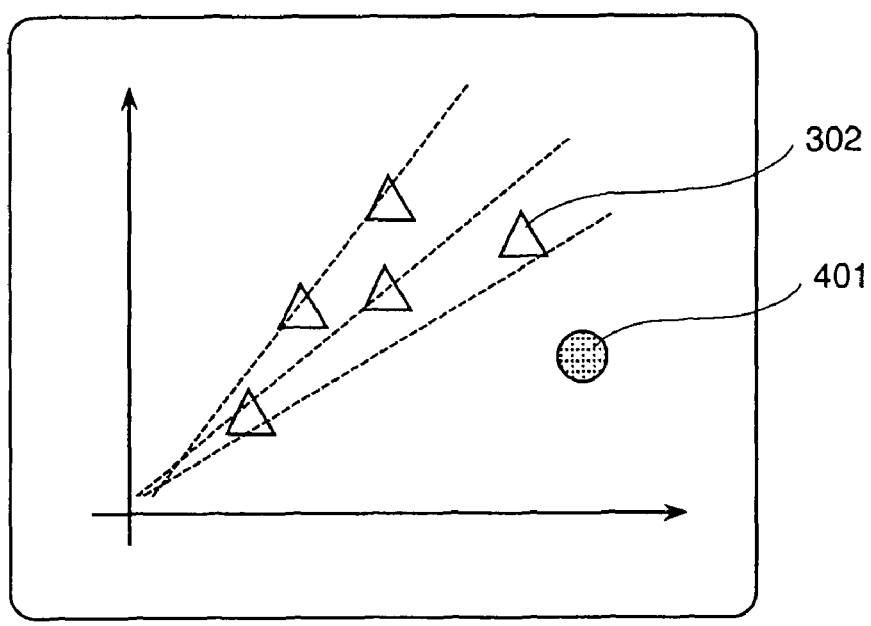
FIG. 4 is a screen window image illustrating another example of the estimation results.

FIG. 4 shows another example of the evaluation result. In this example, the marker 401 representing the evaluated value for the object model is located far from the markers 302 representing the evaluated value for the reference model. Therefore, in case of the less correlated locations found, the modeling method of the reference model and the modeling method of the object model are different from each other even for modeling an identical object shape.

Figures 5, 6:
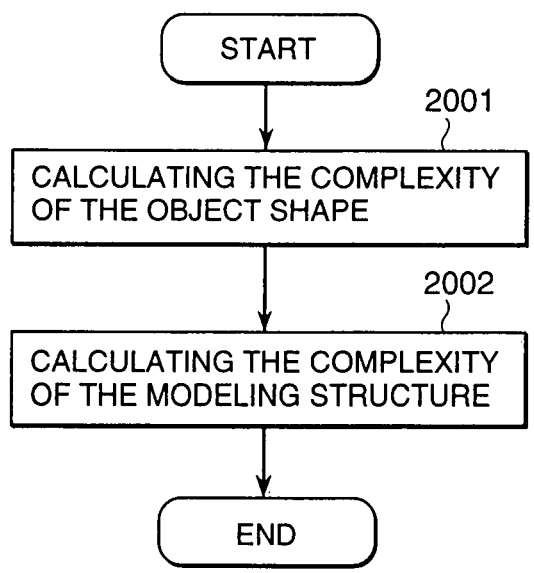
FIG. 5 is a data structure diagram of the reference data base.
FIG. 6 is a flow chart illustrating the computational procedures in the estimation value calculation means.

The reference CAD data base 103 is extracted from the reference CAD data or formed with the calculated property value table. FIG. 5 shows a data structure of the data base 103 containing the property values, which is formed by calculating the values from the reference CAD data or extracting the values from the reference CAD data. The component name is stored by extracting the component name property or the file name recorded in the CAD data. The volume, the surface area and the inertia momentum are calculated by using the geometric calculating function provided by the CAD system. The number of features, the number of defined dimensional parts and the number of surfaces are calculated by enumerating the features representing the partial object shape forming the three-dimensional CAD data, the dimensions contained in the model data and the surfaces of the solid model representing the object shape of the model data.

FIG. 6 shows a procedural flow of the object data evaluated value calculating means. In Step 2001, for example, the volume and the surface area are calculated by the geometric calculating function of the CAD system, and the complexity of the object shape is calculated by the equation 1. In Step 2002, for example, the summation of the number of features forming the model data is calculated and output as the complexity of the modeling structure. The reference data evaluated value calculating means 106 calculates the complexity of the object shape and the complexity of the modeling structure, both of the reference CAD data, are calculated by the procedures similar to those shown in FIG. 6.

Figures 7, 10:
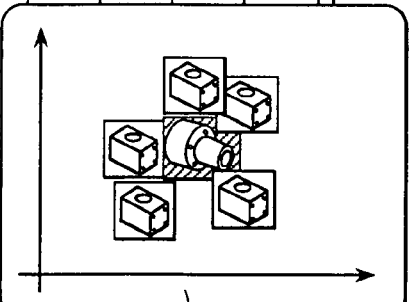
FIG. 7 is a display data structure diagram for displaying the estimation results.
FIG. 10 is a display image for illustrating an example of the screen window configuration of the CAD data estimation apparatus.

The result displaying means 105 receives the evaluated values for both of the object model and the reference model in order to output the graphical representation shown in FIG. 3 and FIG. 4. FIG. 7 illustrates the structure of the data table. The data table stores the component name, the complexity of the object shape and the complexity of the modeling structure, each of the object data, received from the object data evaluated value calculating means 102. The component name, the complexity of the object shape and the complexity of the modeling structure, each of the reference data are received from the reference data evaluated value calculating means 106.

Figure 8A:
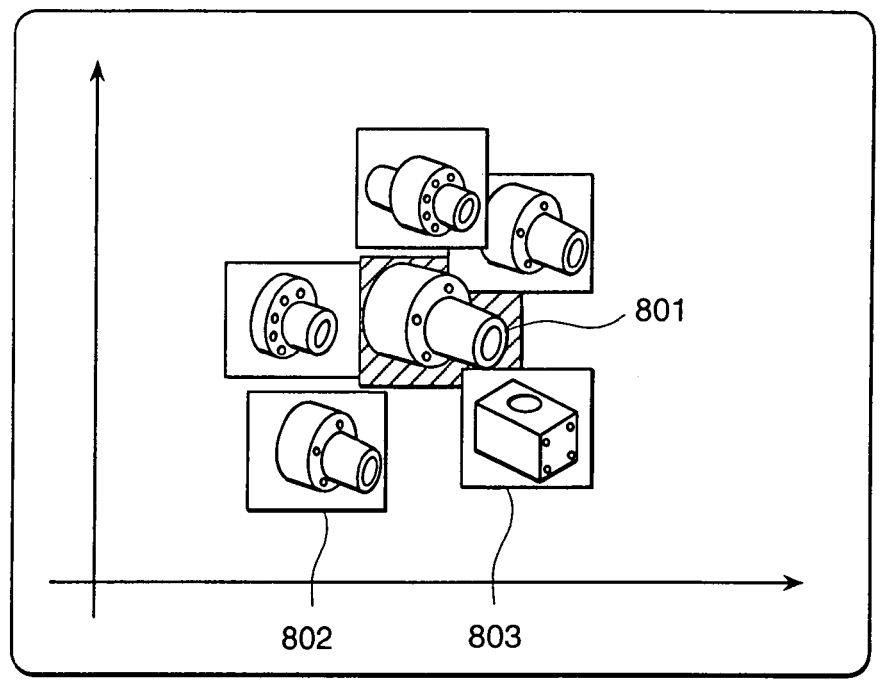
FIG. 8 is a display image for displaying the estimation results by using the design object shape data.
Figure 8B:
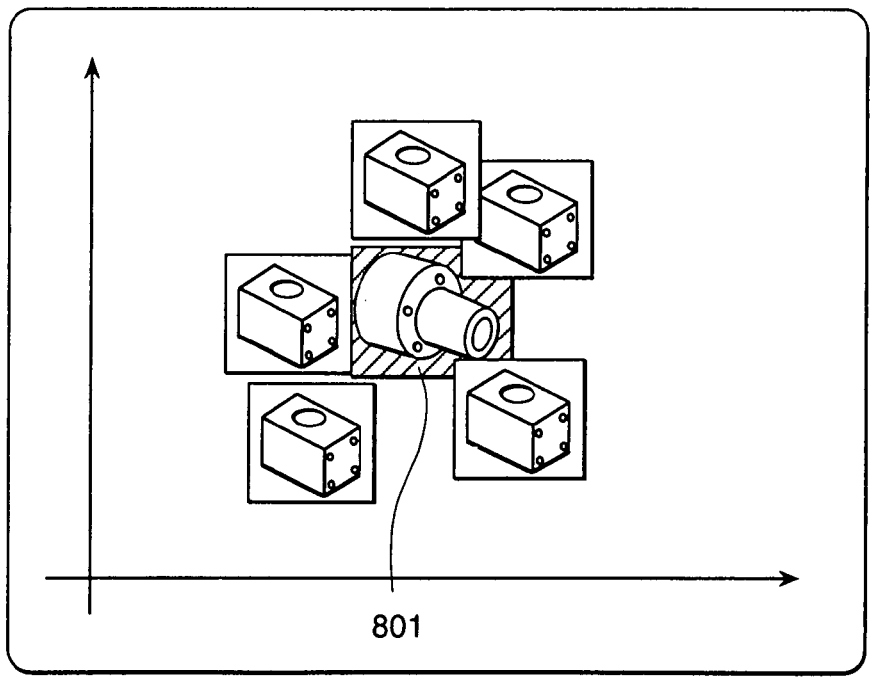

FIG. 8 shows another example of graphical representation by the displaying means. The representation (a) is an example for displaying combined images of the image data received from the individual CAD data. By displaying the object shape images together, the reference shape 802 almost identical to the object shape 801 can be easily recognized in distinction from the reference shape 803 different from the object shape which has the similar values in the complexity of the object shape and the complexity of the modeling structure.

At this point, the image data obtained by the image obtaining function of the CAD system are stored in Data1 to Data4 of the reference CAD data base 103 shown in FIG. 5. The image data obtained from the object CAD data are stored as the object data entries shown in FIG. 7.

In case that large volume shape data are stored in the reference data base 103, the attribute values, the complexity of the object shape and the complexity of the modeling structure of the object CAD data are received from the evaluated value calculating means 102, and then those data are screened in advance by the searching means 104. As the amount of data to be supplied to the evaluated value calculating means can be reduced by this manner, the display speed for displaying the calculated result can be increased and the display image can be recognized easily.

As for the screening method, for example, in case that the component name in the reference data is "Flange", only the data containing "Flange" in those component name are extracted from the reference data base 103. For another screening method, it is allowed to specify the creation data of the model. It is also allowed to extract the model data having the nearest value for the complexity of the object shape and the complexity of the modeling structure calculated by the evaluated value calculating means 102. For example, the model data are extracted such that their complexity of the object shape is located within ±20% around the complexity of the object shape calculated by the evaluated value calculating means 102.

Figure 9:
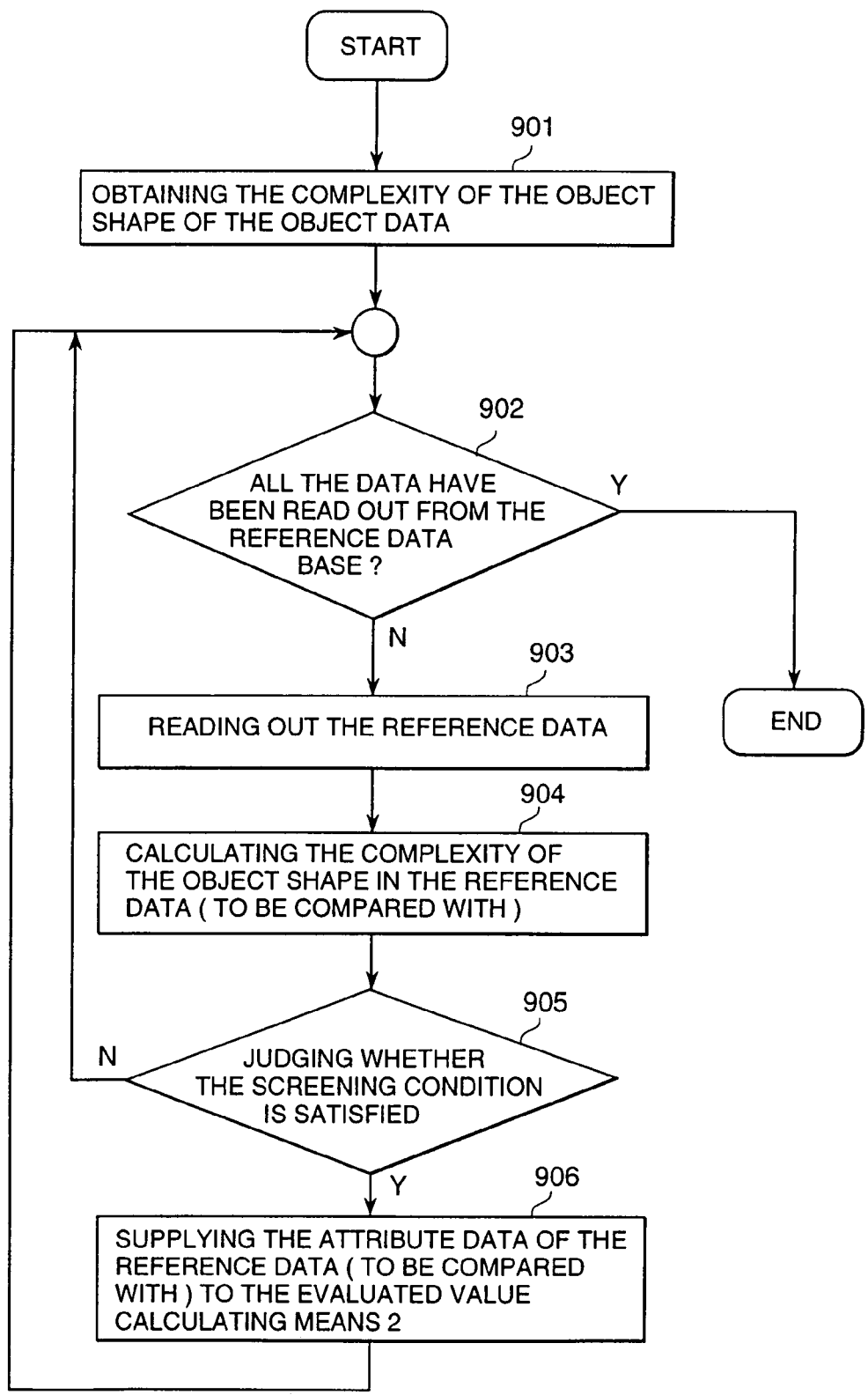
FIG. 9 is a flow chart illustrating the computational procedures for calculating the complexity of the design shape in the reference data based on the restricted conditions.

FIG. 9 shows an example of procedural flow for screening the reference data. This procedural flow is used for screening the reference data in terms of the complexity of the object shape in the searching means 104. In Step 901, the complexity of the object shape of the object data is extracted by the evaluated value calculating means 102. In Step 902, the comparison CAD data stored in the reference data base 103 are read out sequentially followed by Steps 2 through 6 executed repetitively. In Step 903, the CAD data is read out from the reference data base 103. In Step 904, the complexity of the object shape I the reference CAD data (to be compared) is calculated. In Step 905, what is judged is whether the complexity of the object shape in the reference data satisfies the condition defined in advance with respect to the complexity of the object shape in the object data. For example, if the complexity of the object shape in the reference data is located within ±20% around the complexity of the object shape, Step 906 is selected next, in which the attribute data to be compared with are transferred to the evaluated value calculating means 106. If the screening condition is not satisfied, the reference data are not transferred to the evaluated value calculating means 106 but Step 902 is recalled again. The reference data (to be compared with) are screened by the procedures as described above.

Thus, if the screening operation is applied based on the evaluated value of the model to be evaluated, there may be such possibility that the data having various kind of shapes may be extracted from the reference data base 103. In this case, the three dimensional CAD data image to be evaluated and the three-dimensional CAD data image to be compared with extracted from the reference data base are displayed as shown in FIG. 8, which leads to users' easier evaluation work. This means that, as shown in FIG. 8 (a), if there found similar object shapes arranged around the CAD data image to be evaluated, the modeling method in the reference data base and the modeling method of the three-dimensional data to be evaluated are almost identical to one another. On the other hand, as shown in FIG. 8 (b), in the plotting results of the three-dimensional CAD data to be evaluated, if there found much difference between the image to be evaluated and the three-dimensional CAD data images to be compared and located around the graphics image 801, there may be higher possibility that the modeling method of the three-dimensional data to be evaluated is different from the modeling method in the reference data base. Thus, by means of plotting the evaluation results graphically together with the three-dimensional object shape images, it will be appreciated that the comparison of the evaluation result can be effectively facilitated.

FIG. 10 shows an example of the operation image of the CAD data evaluation apparatus. The data input window 1001 is displayed in response to the input from the CAD data inputting means 101. The operator specifies the file name and its destination path in the file system including the three-dimensional CAD data to be evaluated, and presses OK button. Then, now that OK button is pressed, the evaluated value calculating means 102, the searching means 104, the evaluated value calculating means 104 and the displaying means 105 are initiated in accordance with the procedural steps shown in FIG. 9. In the result of those procedures executed, the window 1002 including visually the evaluated data in a table format and the graphic representation window 1003 in which the complexity of the object shape and the complexity of the modeling structure area defined in the vertical and horizontal axes are displayed on the screen. The user compares the evaluation index for the data to be evaluated and the evaluation index for the reference data based on those display results, and then judges whether the modeling method of the data to evaluated is almost identical to or different from the modeling method of the reference data. The evaluation work may be made more facilitated by means that the model data as examples for considering the reusability of the model is stored in the reference data.

Figure 11:
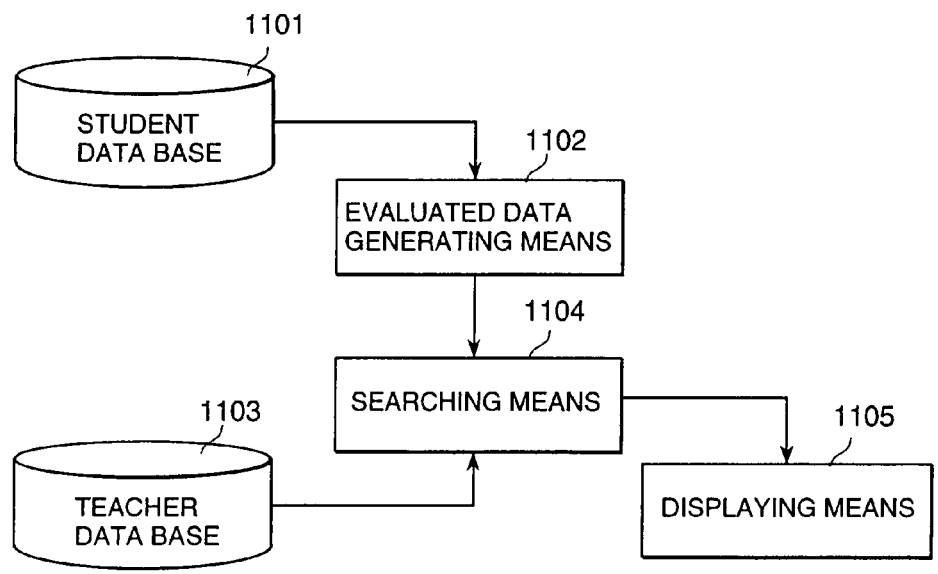
FIG. 11 is a configuration diagram of the CAD data estimation apparatus in another embodiment of the present invention.

Now, another embodiment of the present invention will be described. FIG. 11 is a functional block diagram of the model evaluating means for evaluating the modeling method of the CAD data created by the students in the course for object modeling. The models created by the students are stored in the student data base 1101. The CAD data created by the teacher or instructor are stored in the teacher data base 1103 as the examples. As the teacher data base is used in common for an identical course, it is allowed that the complexity of the object shape and the complexity of the modeling structure for the specific CAD data may be calculated and stored in advance.

The complexity of the object shape and the complexity of the modeling structure for the CAD data stored in the student data base 1101 are calculated by the evaluation data generating means 1102. The teacher data searching means 1104 supplies the evaluated data for the students and the evaluated data for the teacher together to the evaluation result displaying means 1105. The evaluation result displaying means 1105 receives the evaluated data and displays the evaluated data for the students and the evaluated data for the teacher on the screen of the display apparatus 202.

Figure 12:
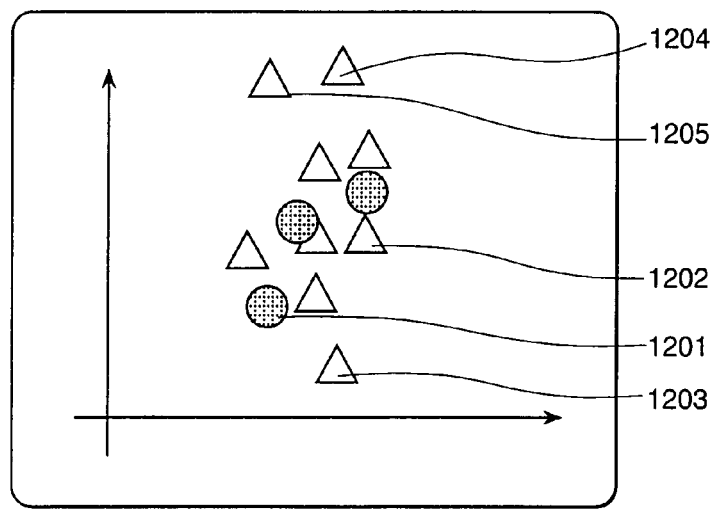
FIG. 12 is a display image of the estimation screen window according to the configuration shown in FIG. 11.

FIG. 12 is an example of the display image provided by the model evaluating means shown by FIG. 11. In this figure, the vertical axis is defined for the complexity of the object shape and the horizontal axis is define for the complexity of the modeling structure. The evaluation result of the teacher data is plotted with block circle as shown by the marker 1201, and the evaluation results of the teacher data plotted with triangles as shown by markers 1202, by which the evaluation result of the teacher data and the evaluation results of the student data can be distinguished graphically from one another. The markers 1202 representing the student data near the evaluation result of the teacher data, the markers 1203 representing the student data having lower complexity of the modeling structure, and the markers 1204 and 1205 representing the student data having larger complexity of the modeling structure can be easily recognized and compared with one another.

It is proved that, in the model created by the student corresponding to the marker 1203, this student applies such a modeling method that the number of features is extremely small because he or she defines the object shape, for example, by making a sketch of the cross-sectional areas with complex shapes. Therefore, it is proved that such a student should be re-educated to learn more skill for making a sketch. On the other hand, in the model created by the student corresponding to the markers 1204 and 1205, the complexity of the modeling structure is extremely high, it is probably proved that those students define individual parts, for example, bolt holes and round corners having identical dimensional sizes which should be defined as a single feature. It is proved that the method for using the pattern feature and the modeling method for defining round corners should be instructed to those students.

In the conventional method, it is required to investigate graphically the individual modeling data one by one by using the CAD system. However, in the CAD data evaluation apparatus according to the present invention, as it is possible to evaluate easily large volume of data created even by many students, it will be appreciated that adequate educational advices can be provided to the students who have problems in their modeling method.

Figure 13:
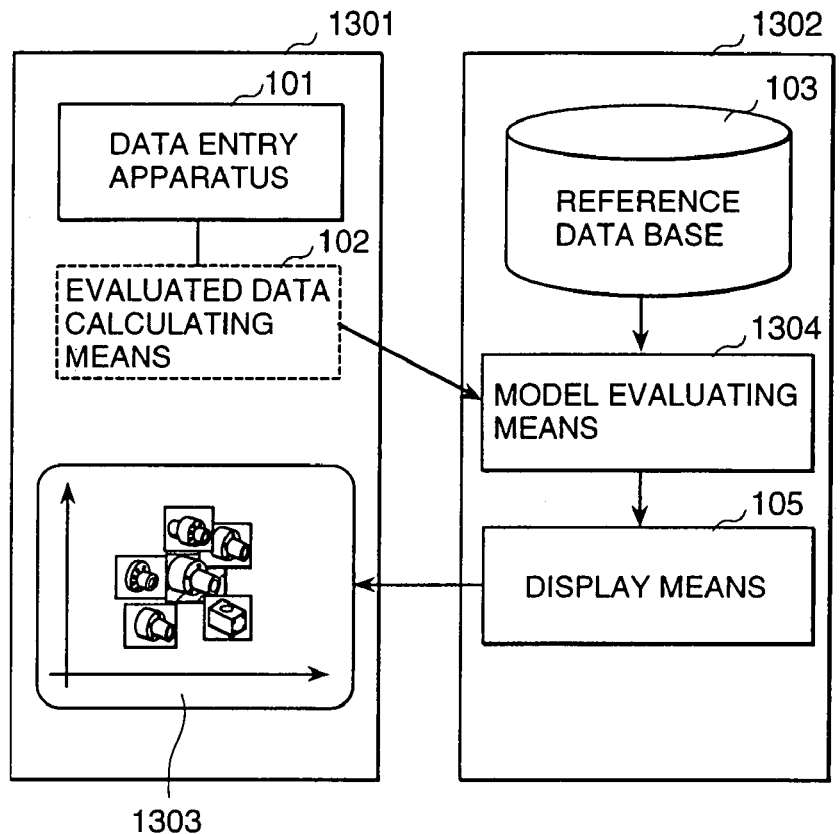
FIG. 13 is a configuration diagram of the CAD data estimation apparatus in another embodiment of the present invention.

FIG. 13 shows another embodiment of the present invention. This is an example in which the model evaluation apparatus is used via network. The computer 1301 at the client side has an object data input apparatus 101 and a displaying means 1303 such as WEB browser, and the computer 1302 at the server side has a model evaluating means 1204, a reference data base 103 and a displaying means 105. The model evaluating means 1304 has the evaluated value calculating means 102 and the searching means 104 and the evaluated value calculating means 106, each shown in FIG. 1.

According to this configuration, it will be appreciated that the object model data may be supplied to the server side computer, and their evaluation results may be transferred from the server side computer to the client side computer, and displayed on the WEB browser 1303. And furthermore, as shown with broken lines in the figure, by installing the evaluated value calculating means 102 for the object data in the client side computer 1301 and supplying only the evaluated value to the server side computer, it is possible to compare the evaluated value with the reference data at the server side computer. As it is not required to transfer the CAD data to the server side computer by means that the evaluated value is calculated at the client side computer, it will be appreciated advantageously that the model evaluation job can be assigned to the server side computer in the evaluation system using Internet.

Figure 14:
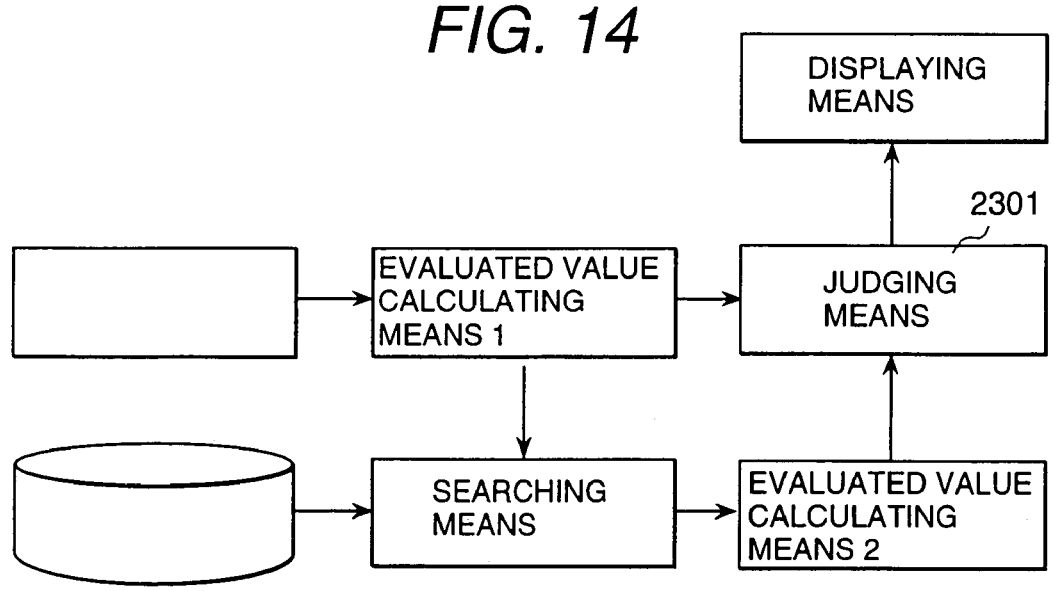
FIG. 14 is a configuration diagram of the CAD data estimation apparatus in another embodiment of the present invention.
Figure 15A:
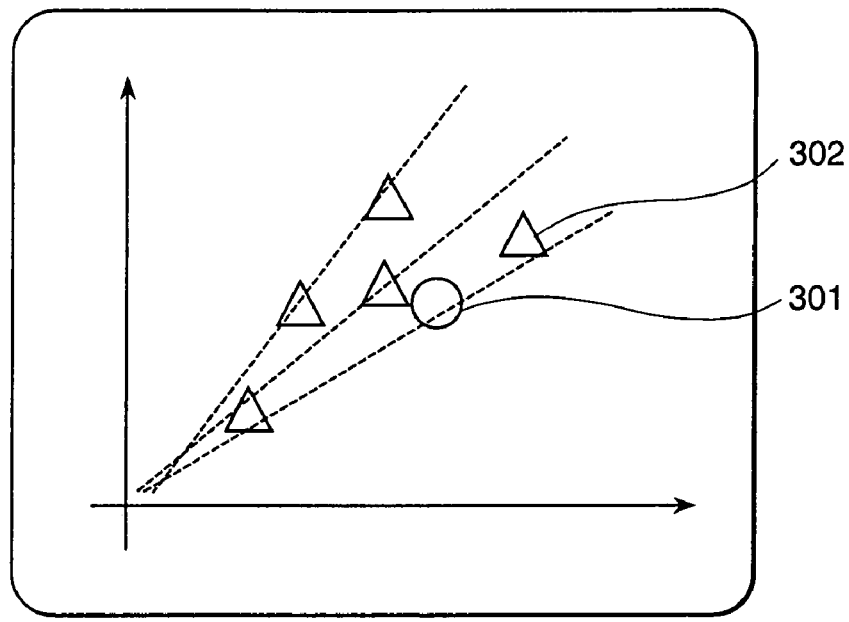
FIG. 15 is a display image of the estimation screen window according to the configuration shown in FIG. 14.
Figure 15B:
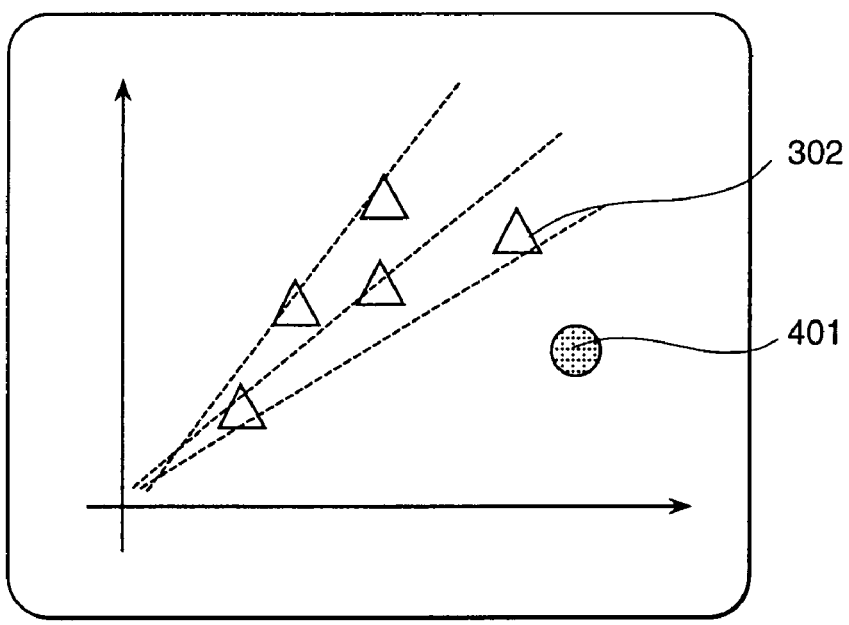

FIG. 14 shows another embodiment of the present invention. This is an example of the structure in which a judging means is added to the configuration of the model evaluating means shown in FIG. 1. That is, this embodiment includes the judging means 2301 for judging whether the CAD data to be evaluated can be reusable or not. The judging means 2301 judges whether the complexity of the object shape and the complexity of the modeling structure of the object data are located within designated value ranges. For example, the judging results are shown graphically as shown in FIG. 15. In the picture (a), which is such a case that the complexity of the object shape and the complexity of the modeling structure of the object data are located within designated value ranges and judged to be reusable, the plotted point is marked by the object marker 301 with white circle. The picture (b) is such a case that those could not be reusable, the plotted point is marked with black circle.

According to the present invention, as the model structure of CAD data can be estimated without using the CAD system, it will be appreciated that the estimation man-hour can be reduced.

According to the present invention, as the estimation results of plural models can be reviewed on a single screen window, it will be appreciated that a large volume of CAD data can be estimated in a short period of time.

And furthermore, according to the present invention, as the estimation is based on the complexity in the design shape and the complexity of the modeling structure, it will be appreciated that the CAD data including arbitrary shaped design objects can be estimated.

What is claimed is:

1. A CAD data evaluation apparatus for evaluating modeling methods of CAD data created by students, comprising:
   a student CAD data base storing CAD data created by a student;
   a CAD data evaluating means for calculating complexity of modeling structure as an evaluated value of student CAD data input from said student CAD data base;
   a teacher data base for storing said complexity of modeling structure as an evaluated value of teacher CAD data to be compared with;
   a searching means for searching evaluated values related to student CAD data in said teacher data base; and a displaying means for displaying evaluated values of said teacher CAD data searched by said searching means and evaluated values of said student CAD data so as to be compared with one another.

2. A CAD data evaluation apparatus for evaluating modeling methods of CAD data created by students, comprising:

a student CAD data base which stores CAD data created by a student;

a CAD data evaluating apparatus configured to calculate an evaluated value of student CAD data input from said student CAD data base, wherein the evaluated value of student CAD data is complexity of modeling structure;

a teacher data base which stores an evaluated value of teacher CAD data to be used for comparison, wherein the evaluated value of teacher CAD data is said complexity of modeling structure;

a search apparatus that is configured to identify evaluated values in said teacher data base that are related to the student CAD data; and a display apparatus configured to display the evaluated values of said teacher CAD data identified by said search apparatus and the evaluated values of said student CAD data, so as to be compared with one another.

* * * * *